United States Patent
Loew et al.

(10) Patent No.: US 10,234,518 B2
(45) Date of Patent: Mar. 19, 2019

(54) LOOP COIL WITH INTEGRATED BALUN FOR MR APPLICATIONS

(71) Applicant: Cincinnati Children's Hospital Medical Center, Cincinnati, OH (US)

(72) Inventors: Wolfgang Manfred Loew, Cincinnati, OH (US); Randy Otto Giaquinto, Cincinnati, OH (US); Charles Lucian Dumoulin, Cincinnati, OH (US)

(73) Assignee: Children's Hospital Medical Center, Cincinnati, OH (US)

( * ) Notice: Subject to any disclaimer, the term of this patent is extended or adjusted under 35 U.S.C. 154(b) by 984 days.

(21) Appl. No.: 14/627,680

(22) Filed: Feb. 20, 2015

(65) Prior Publication Data
US 2015/0241529 A1    Aug. 27, 2015

Related U.S. Application Data

(60) Provisional application No. 61/943,241, filed on Feb. 21, 2014.

(51) Int. Cl.

| | |
|---|---|
| G01R 33/36 | (2006.01) |
| H01F 27/28 | (2006.01) |
| G01R 33/341 | (2006.01) |
| H03H 7/38 | (2006.01) |
| H01F 19/04 | (2006.01) |
| H01F 27/40 | (2006.01) |

(52) U.S. Cl.
CPC ....... *G01R 33/3628* (2013.01); *G01R 33/341* (2013.01); *H01F 19/04* (2013.01); *H01F 27/2823* (2013.01); *H01F 27/40* (2013.01); *H03H 7/38* (2013.01); *H01F 2027/2833* (2013.01)

(58) Field of Classification Search
CPC ............ G01R 33/3628; G01R 33/341; H01F 27/2823; H01F 27/40; H01F 19/04; H03H 7/38

See application file for complete search history.

(56) References Cited

U.S. PATENT DOCUMENTS

| | | | |
|---|---|---|---|
| 4,859,950 A | 8/1989 | Keren | |
| 5,284,144 A * | 2/1994 | Delannoy | ............... A61B 5/055 324/315 |

(Continued)

FOREIGN PATENT DOCUMENTS

WO    2008/115426 A1    9/2008

*Primary Examiner* — Dixomara Vargas
(74) *Attorney, Agent, or Firm* — Baker Hostetler LLP (57) ABSTRACT

An MR loop coil design incorporates a balun into the loop coil. With this approach, some components of the coil may be simultaneously part of the imaging coil and the balun. Further, with this approach the number of components used to build an MR coil may be reduced, which may result in a reduction in cost, weight and size. This MR loop coil design may also be used to build phased array coils from the smaller loop size. Such an approach may use small feeder circuit boards oriented generally perpendicular to the coil elements to reduce interactions between the feeder boards and the coils. Such feeder boards may also be made smaller than conventional feeder circuits because the integrated balun coil design may reduce the number of components needed to create balanced coils in the array.

18 Claims, 7 Drawing Sheets

(56) References Cited

U.S. PATENT DOCUMENTS

| | | | |
|---|---|---|---|
| 5,430,378 A * | 7/1995 | Jones | G01R 33/3415 324/318 |
| 5,477,146 A * | 12/1995 | Jones | G01R 33/34046 324/318 |
| 5,905,378 A * | 5/1999 | Giaquinto | G01R 33/34084 324/318 |
| 6,084,411 A * | 7/2000 | Giaquinto | G01R 33/34084 324/318 |
| 6,249,121 B1 * | 6/2001 | Boskamp | G01R 33/34061 324/318 |
| 6,501,274 B1 * | 12/2002 | Ledden | G01R 33/3453 324/318 |
| 6,608,480 B1 * | 8/2003 | Weyers | G01R 33/3415 324/318 |
| 6,750,652 B2 | 6/2004 | Weyers et al. | |
| 7,012,429 B1 * | 3/2006 | Ledden | G01R 33/3453 324/318 |
| 7,088,104 B2 * | 8/2006 | Bottomley | G01R 33/34046 324/322 |
| 7,141,980 B2 * | 11/2006 | Belt | G01R 33/3415 324/322 |
| 7,253,622 B2 * | 8/2007 | Saylor | G01R 33/34046 324/318 |
| 7,282,915 B2 | 10/2007 | Giaquinto et al. | |
| 7,345,485 B2 * | 3/2008 | Jevtic | G01R 33/3692 324/318 |
| 7,378,851 B1 | 5/2008 | De Rooij et al. | |
| 7,443,163 B2 * | 10/2008 | Warntjes | G01R 33/3657 324/318 |
| 7,508,212 B2 * | 3/2009 | Fain | G01R 33/345 324/318 |
| 7,602,187 B2 * | 10/2009 | Luedeke | G01R 33/34 324/318 |
| 7,652,476 B2 | 1/2010 | De Rooij et al. | |
| 7,714,581 B2 * | 5/2010 | Erickson | G01R 33/345 324/318 |
| 7,733,092 B2 * | 6/2010 | Otake | G01R 33/34046 324/318 |
| 7,795,870 B2 * | 9/2010 | Sodickson | A61B 5/0536 324/309 |
| 7,970,452 B2 | 6/2011 | Piron et al. | |
| 7,973,614 B2 * | 7/2011 | Taracila | G01R 33/365 324/318 |
| 8,179,137 B2 * | 5/2012 | Feng | H03H 5/003 324/307 |
| 8,193,810 B2 * | 6/2012 | Otake | G01R 33/34046 324/307 |
| 8,193,812 B2 * | 6/2012 | Pinkerton | G01R 33/34046 324/318 |
| 8,212,630 B2 | 7/2012 | Endo | |
| 8,369,930 B2 | 2/2013 | Jenkins et al. | |
| 8,421,461 B2 * | 4/2013 | Cork | G01R 33/3415 324/316 |
| 8,547,102 B2 * | 10/2013 | Nozaki | G01R 33/34015 324/318 |
| 8,922,213 B2 * | 12/2014 | Nozaki | G01R 33/34015 324/318 |
| 9,274,084 B2 * | 3/2016 | Goodwill | G01R 33/10 |
| 9,279,863 B2 | 3/2016 | Tsukamoto et al. | |
| 9,459,331 B2 * | 10/2016 | Otake | G01R 33/365 |
| 9,520,636 B2 * | 12/2016 | Ferrand | G01R 33/34076 |
| 9,535,142 B2 * | 1/2017 | Leussler | G01R 33/3415 |
| 9,599,685 B2 * | 3/2017 | Habara | G01R 33/34046 |
| 9,625,551 B2 * | 4/2017 | Ozen | G01R 33/543 |
| 2004/0075435 A1 | 4/2004 | Weyers et al. | |
| 2005/0253582 A1 | 11/2005 | Giaquinto et al. | |
| 2008/0136414 A1 | 5/2008 | De Rooij et al. | |
| 2008/0306377 A1 | 12/2008 | Piron et al. | |
| 2010/0256480 A1 | 10/2010 | Bottomley et al. | |
| 2010/0312096 A1 | 12/2010 | Guttman et al. | |
| 2011/0267062 A1 | 11/2011 | Otake et al. | |
| 2012/0262177 A1 | 10/2012 | Eiermann et al. | |
| 2013/0093425 A1 | 4/2013 | Chu et al. | |
| 2013/0285760 A1 | 10/2013 | Liu et al. | |
| 2015/0355297 A1 | 12/2015 | Menon et al. | |

* cited by examiner

FIG. 7 ized coil element size, with a
small loop size, the placement of the feed circuitry, including
the balun, becomes a limiting factor in the design. A
conventional approach may be problematic because the
components and traces may interact and cover adjacent
elements.

LOOP COIL WITH INTEGRATED BALUN FOR MR APPLICATIONS

CORRESPONDENCE TO RELATED APPLICATIONS

The present application claims priority to U.S. Provisional Application Ser. No. 61/943,241, filed Feb. 21, 2014, the disclosure of which is incorporated herein by reference.

FIELD OF THE INVENTION

The present disclosure relates generally to loop coils used with Magnetic Resonance (MR) imaging systems, and more particularly, to such loop coils that include an integrated balun.

BACKGROUND

The following description includes information that may be useful in understanding the present subject matter. It is not an admission that any of the information provided herein is prior art or relevant to the presently claimed subject matter, or that any publication specifically or implicitly referenced is prior art.

Magnetic Resonance Imaging (MRI) employs a strong magnetic field that is used to polarize the spin magnetization in a patient's body. The spin magnetization that is most often used in MRI arises from the nuclei of hydrogen atoms within the body. Although the highest concentration of hydrogen atoms within the body is found in water molecules, other compounds found in the body (e.g. lipids, glucose, etc.) are present in sufficient concentration to provide a detectable MR spin magnetization.

MR imaging of internal body tissues may be used for numerous medical procedures, including diagnosis and surgery. In general terms, MR imaging starts by placing a subject in a relatively uniform, static magnetic field. The static magnetic field causes hydrogen nuclei spins to align and precess about the general direction of the magnetic field. Radio Frequency (RF) magnetic field pulses are then superimposed on the static magnetic field to cause some of the aligned spins to alternate between a temporary high-energy nonaligned state and the aligned state, thereby inducing an RF response signal, called the MR echo or MR response signal. It is known that different tissues in the subject produce different MR response signals, and this property can be used to create contrast in an MR image. An RF receiver detects the duration, strength, and source location of the MR response signals, and such data are then processed to generate tomographic or three-dimensional images.

Loop coils are widely used for the excitation and detection of signals in MRI. Loop coils are typically designed as symmetric structures with respect to earth ground and may be connected to a coaxial cable for signal transmission. The coaxial cable itself is an unsymmetrical component, and by connecting a symmetric antenna to an asymmetric transmission line a surface current can be generated on the shield of the coaxial cable. To block this surface current, baluns are typically placed between the antenna and the coaxial cable. However, baluns are resonant structures that can interact with the loop coil.

In addition, loop coils are widely used for construction of phased arrays in MR imaging. The size of individual coils in modern arrays is relatively large, which in turn, limits the maximum achievable channel count and acceleration. To reach a very large number of elements and realize the advantages of highly accelerated imaging, the size of each loop coil should be reduced or minimized. Likewise, for accelerated imaging of small anatomy (e.g., the fingers), the size of the coil elements in an array should be small enough so that each element has a unique sensitivity profile. Regardless of the motivation for reducing coil element size, with a small loop size, the placement of the feed circuitry, including the balun, becomes a limiting factor in the design. A conventional approach may be problematic because the components and traces may interact and cover adjacent elements.

SUMMARY

The current disclosure provides an MR loop coil design that incorporates a balun into the loop coil. With this approach, some components of the coil may be simultaneously part of the imaging coil and the balun. Further, with this approach the number of components used to build an MR coil may be reduced, which may result in a reduction in cost, weight and size for a single element. This MR loop coil design may be used to build transmit-only, transmit/receive or receive-only MR coils. This MR loop coil design may also be used to build phased array coils from the smaller loop size. Such an approach may use small feeder circuit boards oriented generally perpendicular to the coil elements to reduce interactions between the feeder boards and the coils ("generally perpendicular" means both perpendicular and not exactly perpendicular—angles of between 70° and 110°, for example are generally perpendicular for the purpose of this application). Such feeder boards may also be made smaller than conventional feeder circuits because the integrated balun coil design may reduce the number of components needed to create balanced coils in the array.

In an embodiment a loop coil adapted for excitation and/or detection of signals in an Magnetic Resonance Imaging (MRI) apparatus includes: a loop coil body of conductor material (which is typically a non-magnetic conductor material); and a matching circuit electrically coupled to the loop coil body and adapted to be electrically coupled to a signal transmission line of an MRI apparatus; where the loop coil body structure includes a balun integrated therein. In a more detailed embodiment at least one component of the loop coil is simultaneously part of an imaging coil and the balun. Alternatively or in addition, at least a first segment of the loop coil body may include a signal transmission line and a second segment of the loop coil body may comprise a conductor that is not part of the signal transmission line. In a more detailed embodiment, the first segment of the loop coil body includes a bi-conductor arcuate element (a pair of conductors separated by a non-conductor), such as a coaxial cable, a microstrip or a stripline. In a more detailed embodiment, the first segment of the loop coil body includes a coaxial cable. In a further detailed embodiment, the second segment of the loop coil body includes a conductive tube. Alternatively or in addition, the first segment of the loop coil body includes an arcuate portion and the second segment of the loop coil body includes an arcuate portion facing the first segment of the loop coil body to form a partially enclosed loop. In some embodiments, this partially enclosed loop may be generally in the shape of a circle, an oval, a rectangle, a rectangle with rounded edges, a hexagon, a solenoid, a figure eight, or a Helmholtz pair and so forth.

In an alternate detailed embodiment, the first segment of the loop coil body may include a coaxial cable, a strip line or a microstrip, and the second segment of the loop coil body may include a conductive tube, wire, or a conductive trace.

In a more detailed embodiment, the first and second segments may be provided on a circuit board material.

Alternatively or in addition, the loop coil of the above embodiments may further include a tuning capacitor coupled between the first segment and the second segment.

Alternatively or in addition, the first segment of the loop coil body may include a coaxial line, the second segment of the loop coil body may include a generally arcuate copper tube facing the first segment of the loop coil body to form a partially or fully enclosed loop and the loop coil may further include a tuning capacitor coupled between the first segment and the second segment of the loop coil body. In a detailed embodiment, the coax line may include an inner conductor extending axially therethrough and the outer conductor may be another copper tube.

Alternatively or in addition, the first segment of the loop coil body may include a generally arcuate microstrip signal line mounted to a circuit board material, the second segment of the loop coil body may include a generally arcuate microstrip conductor material mounted to a circuit board material, the first segment and the second segment may form at least a partially enclosed loop, and the loop coil may further include a tuning capacitor coupled between the first segment and the second segment of the loop coil body. In a further detailed embodiment, the generally arcuate microstrip conductor material of the second segment may include a ground plane microstrip mounted to a surface of the circuit board material opposite to the surface of the circuit board material to which the generally arcuate microstrip signal line of the first segment is mounted.

In an embodiment, the first segment of the loop coil body may comprise a stripline.

Alternatively or in addition, the first segment and the second segment of the loop coil body may be non-symmetric with respect to earth ground.

In any of the above embodiments, the matching circuit may be mounted to a circuit board material and the circuit board material may be oriented generally perpendicular with the loop coil body.

In an embodiment, a loop coil array for use in an MRI system may include a plurality of loop coils as described above arranged in an overlapping array and adapted to be connected to a plurality of signal lines in an MRI system. In a further detailed embodiment, the overlapping array may be arranged in two, three or more layers.

In an embodiment, a radio frequency coil assembly for use in Magnetic Resonance Imaging may include a plurality of coil elements arranged in an overlapping array adapted to connect to a corresponding plurality of signal lines in an MRI system; where each of the plurality of coil elements include a loop coil body of conductor material and a matching circuit electrically coupled to the loop coil body and adapted to be electrically coupled to a signal transmission line of an MRI apparatus, where the loop coil body structure may include the balun integrated therein. In a further detailed embodiment, the plurality of coils may be overlapped in a three layer (or 3-dimensional) configuration. Alternatively or in addition, the matching circuit may be mounted to a circuit board material, and the circuit board material may be oriented generally perpendicular to the loop coil body.

BRIEF DESCRIPTION OF THE DRAWINGS

In order to facilitate a fuller understanding of the inventions disclosed herein, reference is now made to the accompanying drawings, in which like elements are referenced with like numerals. These drawings should not be construed as limiting the inventions, but are intended to be exemplary only.

In the drawings.

DETAILED DESCRIPTION

The current disclosure provides an MR loop coil design that incorporates a balun into the loop coil. With this approach, some components of the coil may be simultaneously part of the imaging coil and the balun. Further, with this approach the number of components used to build an MR coil may be reduced, which may result in a reduction in cost, weight and size. This MR loop coil design may also be used to build phased array coils from the smaller loop size (as well as phased array coils using conventional sized loops). Such an approach may use small feeder circuit boards oriented generally perpendicular to the coil elements to reduce interactions between the feeder boards and the coils. Such feeder boards may also be made smaller than conventional feeder circuits because the integrated balun coil design may reduce the number of components needed to create balanced coils in the array.

MR imaging of internal body tissues may be used for numerous medical procedures, including diagnosis and surgery. In general terms, MR imaging starts by placing a subject in a relatively uniform, static magnetic field. The static magnetic field causes hydrogen nuclei spins to align and precess about the general direction of the magnetic field. Radio frequency (RF) magnetic field pulses are then superimposed on the static magnetic field to cause some of the aligned spins to alternate between a temporary high-energy nonaligned state and the aligned state, thereby inducing an RF response signal, called the MR echo or MR response signal. It is known that different tissues in the subject produce different MR response signals, and this property can be used to create contrast in an MR image. An RF receiver detects the duration, strength, and source location of the MR response signals, and such data are then processed to generate tomographic or three-dimensional images.

Figure 1:
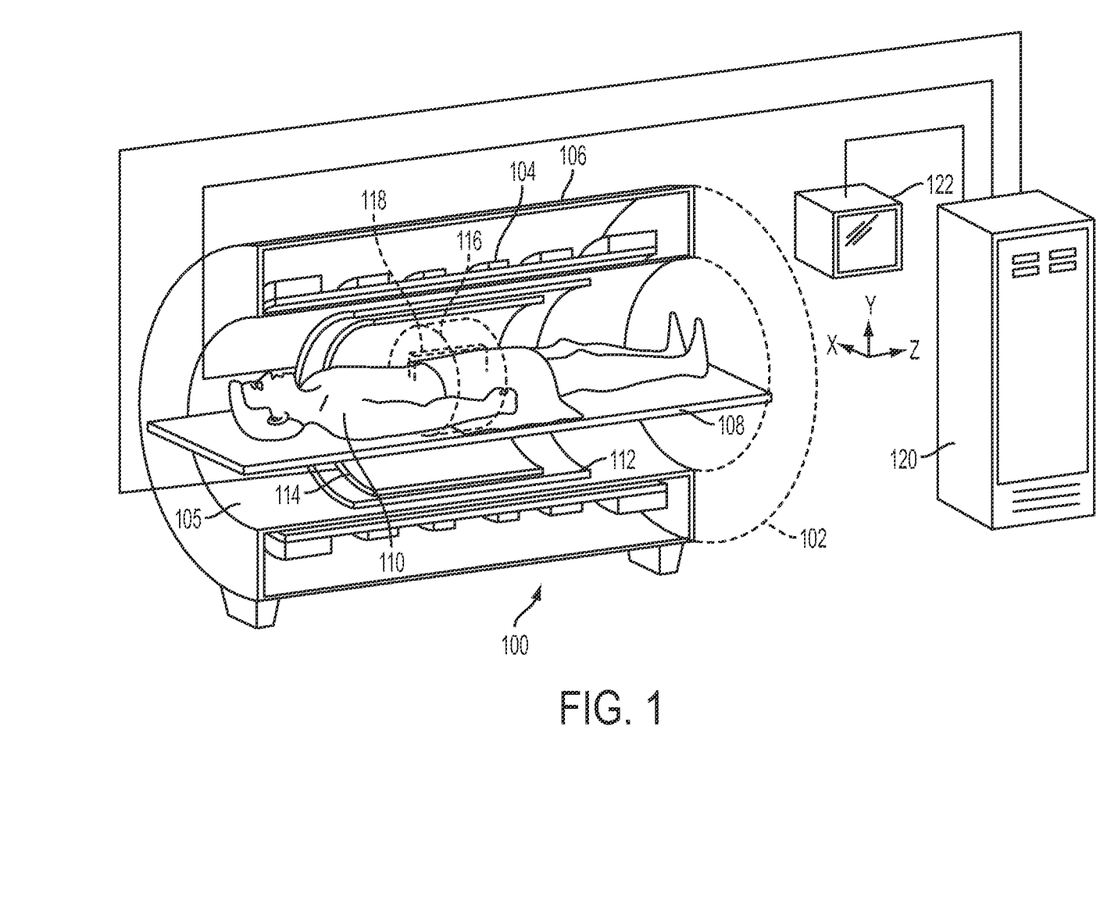
FIG. 1 shows an exemplary MRI system in or for which the present disclosure may be implemented.

FIG. 1 shows an exemplary MRI system 100 in or for which MR imaging in accordance with the present disclosure may be implemented. The illustrated MRI system 100 comprises an MRI magnet assembly 102. Since the components and operation of the MRI scanner are well-known in the art, only some basic components helpful in the understanding of the system 100 and its operation will be described herein.

The MRI magnet assembly 102 typically comprises a cylindrical superconducting magnet 104, which generates a static magnetic field within a bore 105 of the superconducting magnet 104. The superconducting magnet 104 generates a substantially homogeneous magnetic field within an imaging region 116 inside the magnet bore 105. The superconducting magnet 104 may be enclosed in a magnet housing 106. A support table 108, upon which a patient 110 lies, is disposed within the magnet bore 105. A region of interest 118 within the patient 110 may be identified and positioned within the imaging region 116 of the MRI magnet assembly 102.

A set of cylindrical magnetic field gradient coils 112 may also be provided within the magnet bore 105. The gradient coils 112 may also surround the patient 110 (or may surround the part of the patient's body of interest, such as the patient's hand and fingers). The gradient coils 112 can generate magnetic field gradients of predetermined magnitudes, at predetermined times, and in three mutually orthogonal directions within the magnet bore 105. With the field gradients, different spatial locations can be associated with different precession frequencies, thereby giving an MR image its spatial resolution. An RF transmitter coil 114 surrounds the imaging region 116 and the region of interest 118. The RF transmitter coil 114 emits RF energy in the form of a rotating magnetic field into the imaging region 116, including into the region of interest 118.

The RF transmitter coil 114 can also receive MR response signals emitted from the region of interest 118. The MR response signals are amplified, conditioned and digitized into raw data using an image processing system 120, as is known by those of ordinary skill in the art. The image processing system 120 further processes the raw data using known computational methods, including fast Fourier transform (FFT), into an array of image data. The image data may then be displayed on a monitor 122, such as a computer CRT. LCD display or other suitable display.

Figure 2:
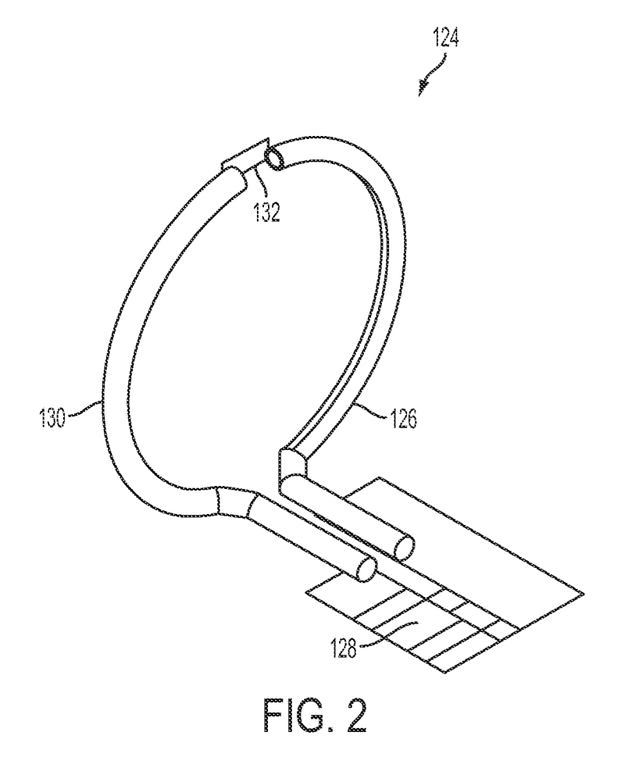
FIG. 2 is a perspective view of a conventional loop coil structure and matching network.

FIG. 2 illustrates a conventional loop coil structure 124 for an RF transmitter or receiver coil 114 for use with such MRI systems. The conventional loop coil structure 124 includes an arcuate copper tube 126 (or an arcuate wire, trace or other sort of conductor) mounted to a matching network circuit 128 and an opposing arcuate copper tube 130 mounted to the matching network circuit board 128. The arcuate copper tubes 126 and 130 face each other to form a substantially closed loop. Coupled between the upper ends of copper tubes 126 and 130 is a tuning capacitor 132.

Figure 3:
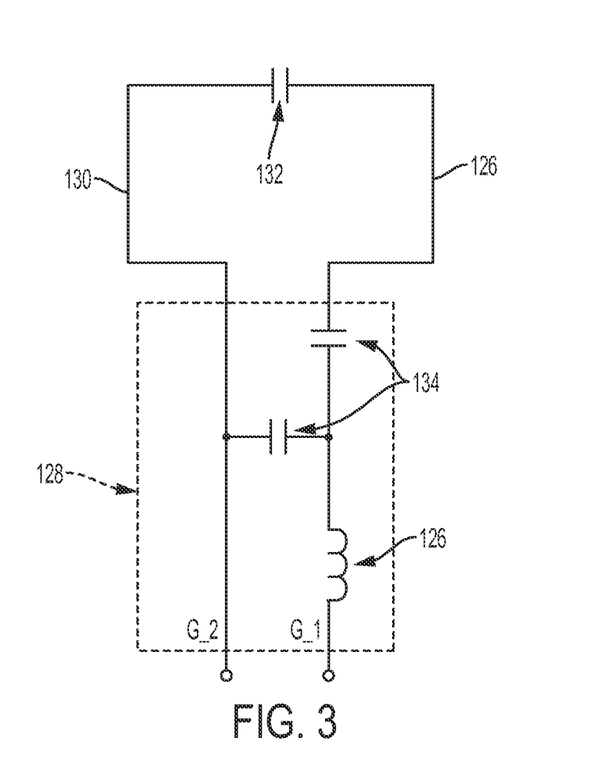
FIG. 3 is a circuit diagram representation of the conventional loop coil as set forth in FIG. 2.

As shown in FIG. 3, the matching network 128 includes a pair of matching capacitors 134 and a matching inductor 136. Copper tubes, wires, or traces, 126 and 130 along with frequency tuning capacitor 132 are also depicted in this circuit diagram. The matching network can be realized as impedance controlled microstrip line, capacitors or inductors, impedance controlled coaxial transmission lines, or a combination of them as will be apparent to those of ordinary skill. The circuit may also include a PIN diode (not shown) coupled between the first and second circuit leads G_1 and G_2.

Figure 4:
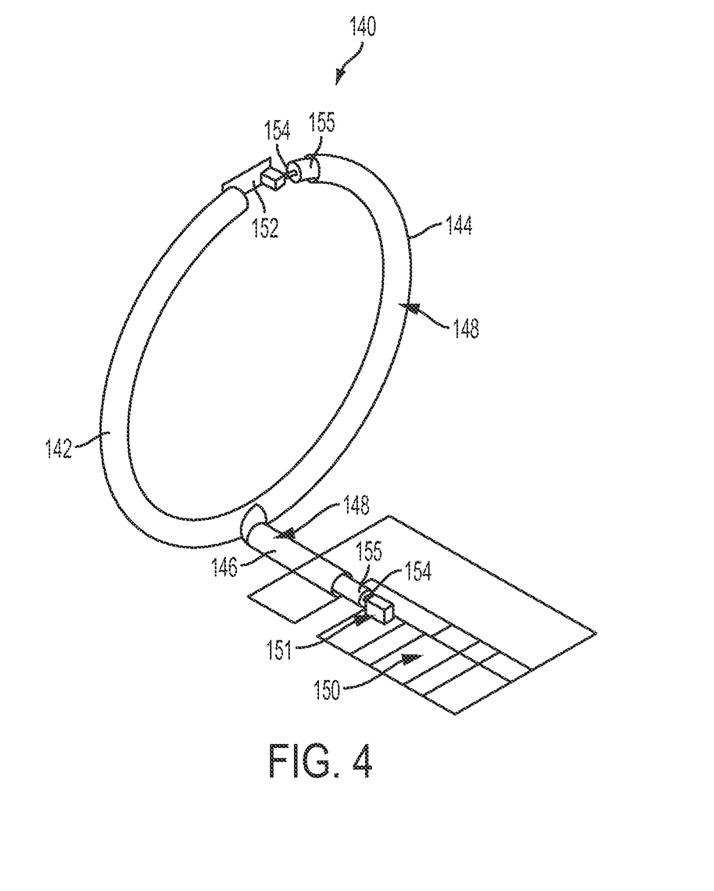
FIG. 4 is a perspective view of a loop coil structure and matching network according to an exemplary embodiment of the current disclosure.

As shown in FIG. 4, an exemplary embodiment of a loop coil according to the current disclosure 140 includes a pair of segments: a first arcuate copper tube segment 144 and a second arcuate copper tube segment 142 facing each other to form a partially enclosed loop. The bottom sections of the first and second copper tube segments 142 and 144 are connected to a copper tube stem segment 146 extending generally axially (generally perpendicularly) from the first and second copper tube segments 144, 142 and is mounted to the matching network circuit board 150 such that the circuit board 150 also extends generally perpendicularly from the loop coil 140. An inner conductor 154 and a dielectric insulator 155 extend through the copper tube segments 144 and 146 forming a coaxial cable 148 in such segments 144, 146, where the dielectric insulator 155 separates the inner conductor 154 from the interior of the copper tube segments 144 and 146. The coaxial cable 148 extends from the matching network circuit board 150 through the stem segment 146 and up through the first copper tube segment 144. At the top of the copper tube segments 142 and 144 a tuning capacitor 152 is electrically coupled between the second copper tube segment 142 to the inner conductor 154 of the coaxial cable 148. The inner conductor 154 of the coaxial cable 148 is also coupled to the matching network 151 provided on the circuit board 150.

Figure 5:
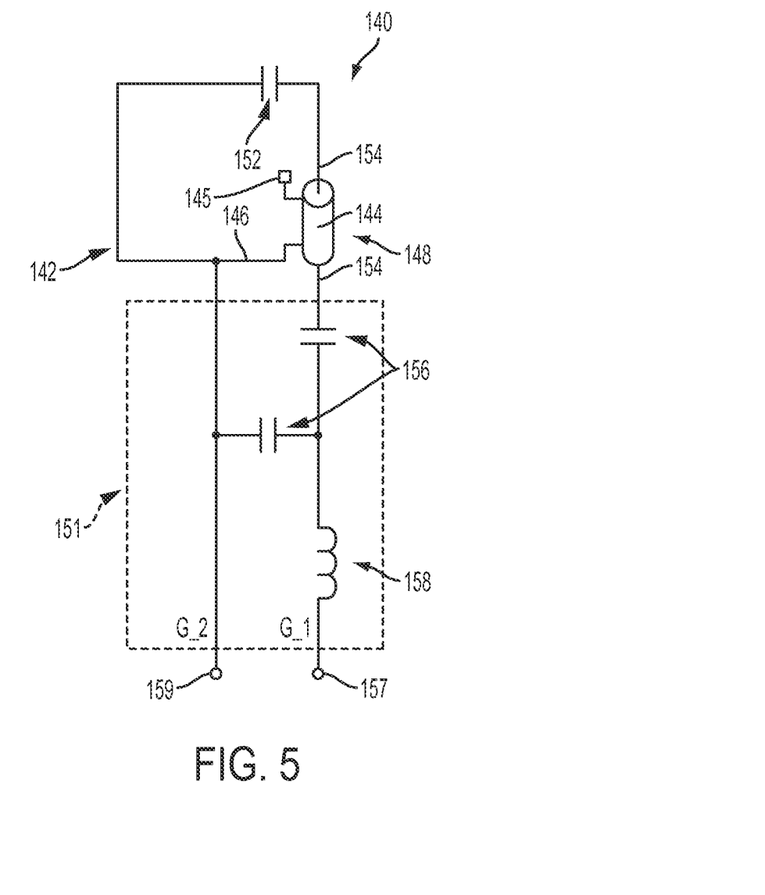
FIG. 5 is a circuit diagram representation of the loop coil design of FIG. 4.

FIG. 5 provides a circuit diagram representation of the loop coil design presented in FIG. 4. As depicted in this diagram, the inner conductor 154 of the coaxial cable 148 is coupled between the matching circuit 151 and the tuning capacitor 152. On the other hand, the outer conductor (the copper tube material of the first segment 144 and the stem segment 146) of the coaxial cable 148 is coupled to the matching circuit 151 at the stem segment 146 end and is unconnected (open 145) at the other end. The matching circuit 151, with capacitors 156 and matching inductor 158 are of conventional design. The circuit may also include a PIN diode (not shown) coupled between the first and second circuit leads 157 and 159 (G_1 and G_2).

By extending the coaxial cable 148 from the matching circuit 151 and through the first segment 144 up to the end of inner conductor 154 of the loop structure 140, the loop structure 140 is thereby created by two segments: the first non-symmetric segment 144 up to the end of inner conductor 154 and the second symmetric segment 142. These two segments of the loop structure 140 create an integrated balun with respect to the loop structure 140. With this approach, some of the components of the coil are simultaneously part of the imaging coil and part of the balun. A desirable aspect of this construction is the ability to reduce the number of components needed to build an MRI coil, resulting in a reduction in cost, weight and size and the ability of miniaturization.

In this embodiment, it is not required that the arcuate segments are circular in shape. Alternative arcuate shapes may include oval shapes, rectangular shapes, rectangular shapes with rounded edges or corners, hexagonal shapes, solenoid, figure eight, or Helmholtz pair and the like. Additionally, the segments may also comprise multi-loop structures. It is also within the scope of the current disclosure that the first and second segments are not facing each other in the same plane—the segments may be in an arbitrary plane/angle to each other. Constructions of the integrated balun coil with more than two arcuate elements are also within the scope of the current disclosure. This approach will be appreciated to those of ordinary skill and may include the use of multiple tuning capacitors distributed around the loop (e.g., the balun portion may occupy only 120 degrees of arc, while non-balun portion covers the remaining 240 degrees with tuning capacitors at both the 120 and 240 degree marks).

To test the above exemplary embodiment, an Integrated Balun Coil (IBC) 140 as described above was designed and built. The sensitivity and field pattern of the IBC was evaluated using electromagnetic field simulation and compared to a standard loop coil 124 having identical dimensions. Imaging experiments were conducted with a phantom to validate the simulations for both the IBC and conventional loop coil.

To compare conventional loop coils to the new integrated balun design, two coils with an outer diameter of about 30 mm were modeled in a commercially available modeling software. The conventional loop coil was modeled with a 2.196 mm diameter copper tube conductor having a 0.26 mm wall thickness. A single tuning capacitor was used to resonate the coil at 127.74 MHz. The integrated Balun coil was modeled using 2.196 mm diameter semi-rigid coaxial cable on one half of the loop and a 2.196 mm copper tube on the other half.

Both coils were matched with a capacitor and inductor matching network. To obtain network parameters the simulation was swept from 117.74 MHz to 137.74 MHz. Loading was simulated by placing the coil 5 mm over a 15 cm×7.5 cm×15 cm phantom containing a 0.9% saline solution of 1.55 S/m conductivity. An air box surrounded the simulation setup. All matching components were mounted on a circuit board with a 90° angle from a coil plane. Signal excitation was a frequency swept 1 W continuous wave source with a 50Ω impedance. Field profiles were solved at 127.74 MHz for both the loop and integrated balun coil.

For MR measurement two coils identical to the simulation setup were constructed. A rectangular bottle (17.5 cm×10 cm×13.5 cm) containing 2.2 g/l NaCl2 and 1 g/l CuSO4 was used as an imaging phantom. The coils were centered on the phantom with a distance of about 5 mm to the phantom solution separated by the bottle wall and a small FR4 sheet. Each coil was tuned and matched to the CuSO4 phantom. At 127.74 MHz the IBC had an impedance of $(50.2-j4.1)\Omega$ and the loop coil had an impedance of $(55.7+j1.0)\Omega$.

Imaging experiments were performed on a Philips 3 Tesla Achieva™ (Philips Healthcare, Best, Netherlands) with both coils on the CuSO4 filled phantom. Coronal slices were acquired using a spin echo sequence (90° flip angle, TR: 1000 msec, TE: 19 msec, FOV 64×64, Matrix 256×256, BW: 106.2 Hz) for each coil.

The sensitivity profile of the IBC showed a symmetric shape from the top to the bottom of the image. A slight left/right shift of the sensitivity profile from the coil center due to dielectric effects of the 3T field strength was noted. The sensitivity profile of the conventional loop coil showed a slightly less symmetric pattern from top to bottom and the same left and right shift seen with the IBC. MR images in the phantom correlated very well with the simulated B1 sensitivity results.

Figure 6A:
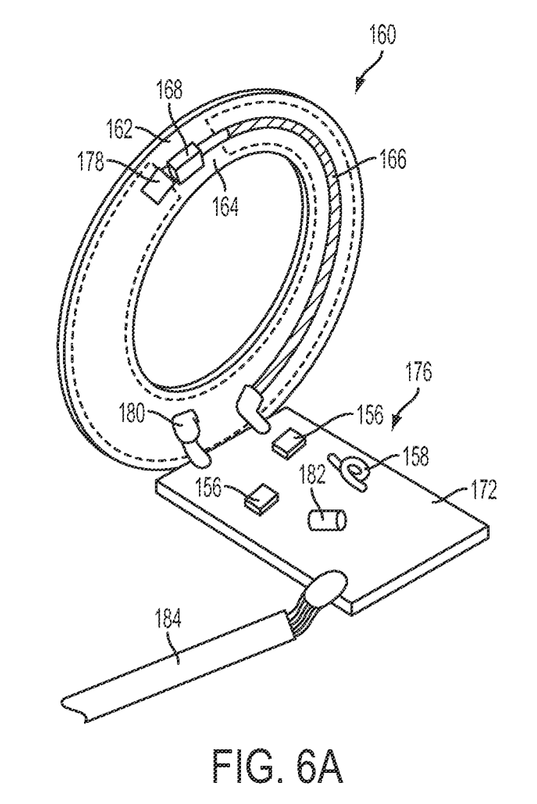
FIG. 6A is a perspective view of another embodiment of a loop coil structure and matching network according to another exemplary embodiment of the current disclosure.
Figure 6B:
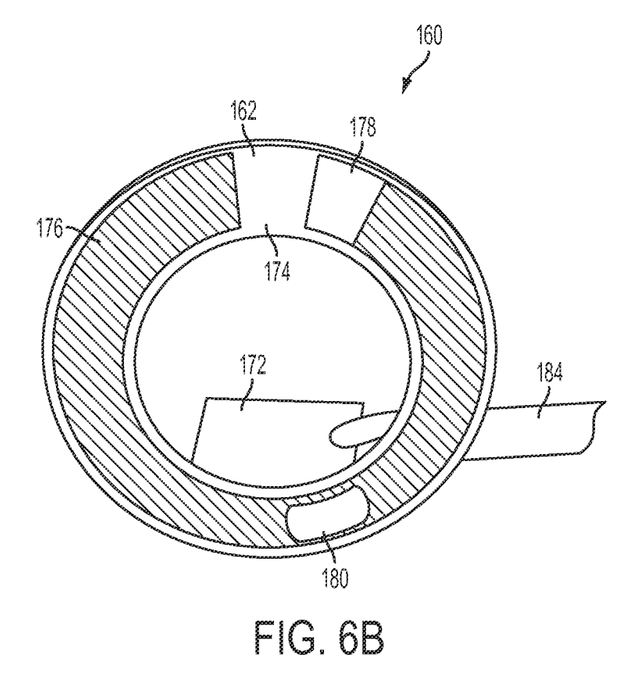
FIG. 6B is a perspective rear view of the loop coil structure of FIG. 6A.

FIGS. 6A and 6B illustrate another embodiment 160 of the loop coil structure according to the current disclosure manufactured on a circuit board material 162. As shown in FIGS. 6A and 6B, the circuit board material 162 on which the loop coil structure is mounted is in the form of a closed loop. On a first surface 164 of the circuit board material 162, a microstrip signal line 166 is formed in an arc extending from the bottom of the circuit board material to the top of the circuit board material and is electrically coupled to a first lead of a frequency tuning capacitor 168 positioned at the top of the closed loop formed by the circuit board material 162. At the bottom of the circuit board loop, the microstrip signal line 166 is electrically coupled to the matching circuit 170 mounted on circuit board 172. In this embodiment, circuit board material 162 of the loop coil and circuit board 172 of the matching circuit 170 are mounted generally perpendicular with respect to one another, the benefit of which will be explained below.

The opposite side 174 of the circuit board material 162 includes a conductive ground layer 176 formed thereon which extends completely around the circuit board material 162 except for an opening or discontinuity approximate the position of the frequency tuning capacitor 168. A via 178 electrically couples the second lead of the capacitor 168 with the conductive ground layer 176. A second via 180 allows the conductive ground layer 176 to be electrically coupled to the matching circuit 172. As discussed above, the matching circuit may be conventional in design and may include a pair of matching capacitors 156 and a matching inductor 158 and may also include a PN diode 182. As shown in FIGS. 6A and 6B a coaxial cable signal line 184 is electrically coupled to the matching circuit board 172.

In comparison to the first embodiment 140, the circuit board approach 160 may be more easily built and may be less expensive. It may also be more easily manufactured using automated fabrication techniques. As with the first embodiment, the shapes of the arcuate microstrip signal line 166 and the ground layer 176 need not be circular. For example, alternative arcuate shapes may include oval shapes, rectangular shapes, rectangular shapes with rounded edges or corners, hexagonal shapes, and the like. It is also within the scope of the current disclosure that the circuit board material not be on a single plane—for example, it may be bent or angled as desired.

In an embodiment, the first segment of the loop coil body may comprise a stripline. A stripline is signal line fully enclosed by two ground planes on top and bottom of the signal line. A dielectric material isolates the grounds from the signal line. Therefore all field lines are enclosed in the dielectric region. It carries a pure TEM (transverse electromagnetic) wave like a coaxial cable, which means the fields do not have a z-component H(Hx, Hy, Hz=0) and E(Ex, Ey, Ez=0). The signal line in combination with one of the ground planes forms the bi-conductor.

A microstrip is signal line with a dielectric material between signal line and a ground plane, where the signal line and ground plane form the bi-conductor. The microstrip has most of its field lines between signal trace and ground plane, but some fraction is in the air above the signal line. Therefore it cannot support a pure TEM wave. It constitutes a hybrid TM-TE wave. However, the dielectric substrate is very thin compared to the wavelength of the signal. That is why the fields are quasi TEM. In terms of phased arrays the microstrip approach might have more coupling then a stripline approach between neighbors. The other advantage of the stripline approach is that thick copper can be simulated with two copper layers and vias connecting them.

Figure 7:
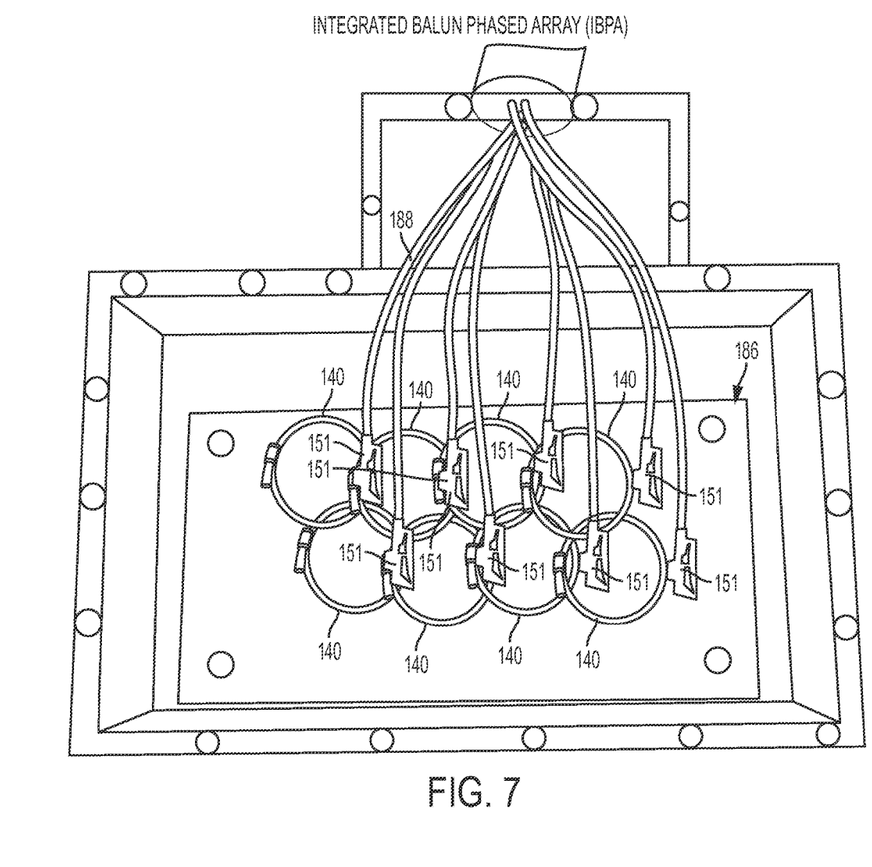
FIG. 7 is a perspective view of a loop coil array structure incorporating loop coil structures according to the current disclosure.

FIG. 7 presents a perspective view of an eight channel integrated balun-phased array 186 which may be used, for example, to image small anatomical features. As shown in FIG. 7, eight of the loop coils 140 as described above, are arranged in an overlapping array 186 where the coils are not electrically coupled at the overlap points. In the current embodiment, the overlapping array is arranged in three layers, although alternate numbers of layers are within the scope of this disclosure, as well as various interleaved configurations. Each of the loop coils 140 include a matching circuit board 151 mounted generally perpendicular to the respective loop coil to further allow the loop coils to be arranged in such a manner. Because the matching circuit boards 151 are arranged generally perpendicularly, they extend vertically up from the array so that the corresponding coaxial cables 188 for communicating with the MRI system easily extend from the vertically extending circuit boards 151.

The feeder boards may be made smaller than conventional feeder circuits by incorporating the balun into the coil design, thereby reducing the number of components needed to create balanced coils in the array.

The benefits of the integrated balun-phased array were investigated using an eight-channel array with small elements for high resolution imaging of small objects. Each integrated balun coil was constructed using a 2.196 mm diameter semi-rigid coaxial cable on one half of the loop and 2.196 mm in diameter copper tube on the other half. The center conductor of the semi-rigid coax was connected to the tuning capacitor which is comprised of a fixed and a variable capacitor placed in parallel. The shield of the semi-rigid coax was connected to the copper tube near the feeder circuit (i.e. opposite from the tuning capacitors). A schematic is shown in FIG. 5.

The tested eight-channel array was 10.7 cm long, 5 cm wide, and mounted on a 17.8 cm×15.7 cm×4.2 cm Lexan coil former. Each coil was tuned to 127.74 MHz. Coils were overlapped for minimum mutual inductance by hand and fixed in place with hot glue. A 3-layer stack up was used to accommodate the solid loop design. The whole array was tuned and matched to a human hand. S-Parameters were measured with a Rhode & Schwarz ZNC Vector Network Analyzer. Measurements for the diagonal elements of the S-Parameter matrix (S11) were performed by connecting each individual channel to the analyzer with the other elements were preamp decoupled. Transmission measurements (S21) were performed by connecting the desired channels to both network analyzer ports. Channel numbering starts with the element on the right bottom of FIG. 2 followed by number two in the coil row above. Number 3 is the coil bottom row to the left of channel and so forth. The S-Parameter matrix in depicted in Table 1, below.

TABLE 1

| CH | 1 | 2 | 3 | 4 | 5 | 6 | 7 | 8 |
|---|---|---|---|---|---|---|---|---|
| 1 | −22.0 | −15.0 | −10.3 | −7.7 | −9.1 | −11.8 | −23.8 | −23.4 |
| 2 |  | −26.0 | −11.5 | −22.2 | −7.0 | −8.1 | −12.6 | −27.6 |
| 3 |  |  | −18.9 | −9.6 | −6.2 | −6.2 | −12.7 | −29.8 |
| 4 |  |  |  | −21.0 | −13.0 | −14.1 | −10.8 | −9.1 |
| 5 |  |  |  |  | −27.5 | −7.5 | −12.0 | −10.0 |
| 6 |  |  |  |  |  | −30.1 | −18.2 | −15.6 |
| 7 |  |  |  |  |  |  | −25.0 | −18.5 |
| 8 |  |  |  |  |  |  |  | −22.0 |

Imaging measurements were performed on a Philips 3T Achieva™ (Philips Healthcare, Best, Netherlands). For safety a cable balun was added between the array and the MR system interface. For phantom imaging a turbo spin echo sequence was used with a 90° flip angle, a TR: 305 msec, an FOV of 50 mm×50 mm, a slice thickness of 3 mm, and coil sensitivity balancing (CLEAR) was enabled. Axial images of the fingers were acquired using a turbo spin echo sequence with a 90° flip angle, a TR: 305 msec, a TE: 15 msec, a FOV of 60 mm×60 mm, a slice thickness of 3 mm, and CLEAR enabled. Coronal hand images were acquired with the same sequence and the following parameters: TR: 2161 msec, TE: 27 msec, FOV: 70 mm×70 mm, and slice thickness of 1.5 mm. A matching of better than −18.9 dB to a human hand was achieved for all channels. A voxel resolution of 0.4 mm×0.4 mm×3 mm was achieved with standard scanner settings during imaging.

While the exemplary embodiment utilizes all integrated balun loop coils to make up the array, it is within the scope of the current disclosure that the array may include a plurality of the integrated balun coils in combination with one or more conventional loop coils and/or loop coils of alternate designs.

This novel technology enables the design of ultra-high dense arrays which will allow new applications in parallel imaging and ultra-short acquisition. Moreover, this technology may be ideal for dedicated pediatric phased arrays to achieve high temporal and spatial resolution, potentially without the need to sedate a child because of the short acquisition time.

While the foregoing disclosure includes many details and specificities, it is to be understood that these have been included for purposes of explanation and example only, and are not to be interpreted as limitations of the inventions described herein. It will be apparent to those skilled in the art that other modifications to the embodiments described above can be made without departing from the spirit and scope of the inventions as claimed. Accordingly, such modifications are to be considered within the scope of such inventions. For example, while the loop coils described herein are disclosed and imaged as being generally circular, it is within the scope of the inventions to provide alternate closed-loop or semi-closed-loop for the loop coil structures such as rectangular, rectangular with curved corners, oval, hexagonal and the like.

Likewise, it is to be understood that it is not necessary to meet any or all of the identified advantages or objects of any of the inventions described herein in order to fall within the scope of the claims, since inherent and/or unforeseen advantages of such inventions may exist even though they may not have been explicitly discussed herein.

All publications, articles, patents and patent applications cited herein are incorporated into the present disclosure by reference to the same extent as if each individual publication, article, patent application, or patent was specifically and individually indicated to be incorporated by reference.

What is claimed is:

1. A loop coil adapted for at least one of the excitation and detection of signals in a magnetic resonance imaging (MRI) apparatus, comprising:
   a loop coil body; and
   a matching circuit electrically coupled to the loop coil body;
   wherein a first segment of the loop coil body is electrically coupled to a signal transmission line of the MRI apparatus via the matching circuit and a second segment of the loop coil body comprises a conductor that is not part of the signal transmission line; and
   wherein the first segment of the loop coil body includes a balun integrated therein.

2. The loop coil of claim 1, wherein at least one component of the loop coil is simultaneously part of an imaging coil and the balun.

3. The loop coil of claim 1, wherein the first segment of the loop coil body includes a biconductor.

4. The loop coil of claim 3, wherein the biconductor of the first segment is one of a: coaxial line, a microstrip and a stripline.

5. The loop coil of claim 1, wherein:
   the first segment of the loop coil body includes a coaxial cable; and
   the second segment of the loop coil body includes a conductive line.

6. The loop coil of claim 3 wherein:
   the first segment of the loop coil body includes an arcuate portion; and the second segment of the loop coil body includes an arcuate portion facing the first segment of the loop coil body to form at least a partially enclosed loop.

7. The loop coil of claim 6, wherein the at least partially enclosed loop is generally in the shape of one of the following:
circular;
multi-loop;
oval;
rectangular;
rectangular with rounded edges;
hexagonal;
solenoid;
figure eight; and
Helmholtz pair.

8. The loop coil of claim 1, wherein:
the first segment of the loop coil body includes one or more of a coaxial cable, a strip line and a microstrip; and
the second segment of the loop coil body includes one or more of a conductive tube, conductive wire, and a conductive trace.

9. The loop coil of claim 1, further comprising a tuning capacitor coupled between the first segment and the second segment.

10. The loop coil of claim 1, wherein:
the first segment of the loop coil body includes a generally arcuate coaxial cable having a copper outer conductor;
the second segment of the loop coil body includes a generally arcuate copper conductor facing the first segment of the loop coil body to form at least a partially enclosed loop; and
the loop coil further comprises a tuning capacitor coupled between the first segment and the second segment of the loop coil body.

11. The loop coil of claim 1, wherein:
the first segment of the loop coil body includes a generally arcuate microstrip signal line mounted to a circuit board material;
the second segment of the loop coil body includes a generally arcuate microstrip conductor material mounted to a circuit board material;
the first segment and the second segment form at least a partially enclosed loop; and
the loop coil further comprises a tuning capacitor coupled between the first segment and the second segment of the loop coil body.

12. The loop coil of claim 11, wherein the generally arcuate microstrip conductor material of the second segment comprises a ground plane microstrip mounted to a surface of the circuit board material opposite to the surface of the circuit board material to which the generally arcuate microstrip signal line of the first segment is mounted.

13. The loop coil of claim 1, wherein the first segment and second segment of the loop coil body are non-symmetric with respect to earth ground.

14. The loop coil of claim 1, wherein the matching circuit is mounted to a circuit board material, and the circuit board material is oriented generally perpendicular to the loop coil body.

15. A loop coil array for use in a Magnetic Resonance Imaging (MRI) system comprising a plurality of loop coils as claimed in claim 1 arranged in an overlapping array and adapted to be connected to a plurality of signal lines in an MRI system.

16. A radio frequency (RF) coil assembly for use in a Magnetic Resonance Imaging (MRI) system comprising:
a plurality of coil elements arranged in an overlapping array adapted to connect to a corresponding plurality of signal lines in the MRI system;
each of the plurality of coil elements including,
a loop coil body of conductor material, and
a matching circuit electrically coupled to the loop coil body;
wherein a first segment of the loop coil body is electrically coupled to a signal transmission line of the MRI system via the matching circuit and a second segment of the loop coil body comprises a conductor that is not part of the signal transmission line; and
wherein the first segment of the loop coil body includes a balun integrated therein.

17. The radio frequency (RF) coil assembly of claim 16, wherein the plurality of coils are overlapped in a three-deep configuration.

18. The radio frequency (RF) coil assembly of claim 16, wherein the matching circuit is mounted to a circuit board material, and the circuit board material is oriented generally perpendicular to the loop coil body.

* * * * *